US008139412B2

(12) United States Patent
Kohler et al.

(10) Patent No.: US 8,139,412 B2
(45) Date of Patent: Mar. 20, 2012

(54) SYSTEMATIC ERROR CORRECTION FOR MULTI-LEVEL FLASH MEMORY

(75) Inventors: Ross A. Kohler, Allentown, PA (US); Richard J. McPartland, Nazareth, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 140 days.

(21) Appl. No.: 12/682,162

(22) PCT Filed: Oct. 31, 2007

(86) PCT No.: PCT/US2007/083162
§ 371 (c)(1),
(2), (4) Date: Apr. 8, 2010

(87) PCT Pub. No.: WO2009/058140
PCT Pub. Date: May 7, 2009

(65) Prior Publication Data
US 2010/0229035 A1  Sep. 9, 2010

(51) Int. Cl.
*G11C 16/00* (2006.01)
(52) U.S. Cl. ......... 365/185.09; 365/185.03; 365/185.22; 365/185.24
(58) Field of Classification Search ............... 365/185.02
See application file for complete search history.

(56) References Cited

U.S. PATENT DOCUMENTS

| 4,057,788 | A | * | 11/1977 | Sage ................... 365/185.19 |
| 5,523,972 | A | * | 6/1996 | Rashid et al. .......... 365/185.22 |
| 5,629,890 | A | * | 5/1997 | Engh et al. ............ 365/185.03 |
| 5,684,741 | A | * | 11/1997 | Talreja ................ 365/185.22 |
| 5,717,632 | A | * | 2/1998 | Richart et al. .......... 365/185.2 |
| 6,151,246 | A | * | 11/2000 | So et al. ................ 365/185.09 |
| 2005/0013165 | A1 | | 1/2005 | Ban |
| 2005/0201148 | A1 | | 9/2005 | Chen et al. |
| 2007/0070696 | A1 | | 3/2007 | Avraham et al. |
| 2007/0159888 | A1 | | 7/2007 | Tu et al. |
| 2007/0201274 | A1 | | 8/2007 | Yu et al. |

OTHER PUBLICATIONS

PCT International Search Report and the Written Opinion dated May 7, 2008, for International Application No. PCT/US2007/083162.

* cited by examiner

*Primary Examiner* — Tan T. Nguyen
(74) *Attorney, Agent, or Firm* — Mendelsohn, Drucker & Associates, P.C.; David L. Cargille; Steve Mendelsohn

(57) ABSTRACT

In accordance with exemplary embodiments, a multi-level flash memory employs error correction of systematic errors when reading multi-level flash memory. Error correction includes i) detection of each systematic error, ii) feedback of the systematic error to circuitry within the memory, and iii) subsequent adjustment within that circuitry to cause a correction of systematic error in the output signal of the multi-level flash memory.

20 Claims, 4 Drawing Sheets

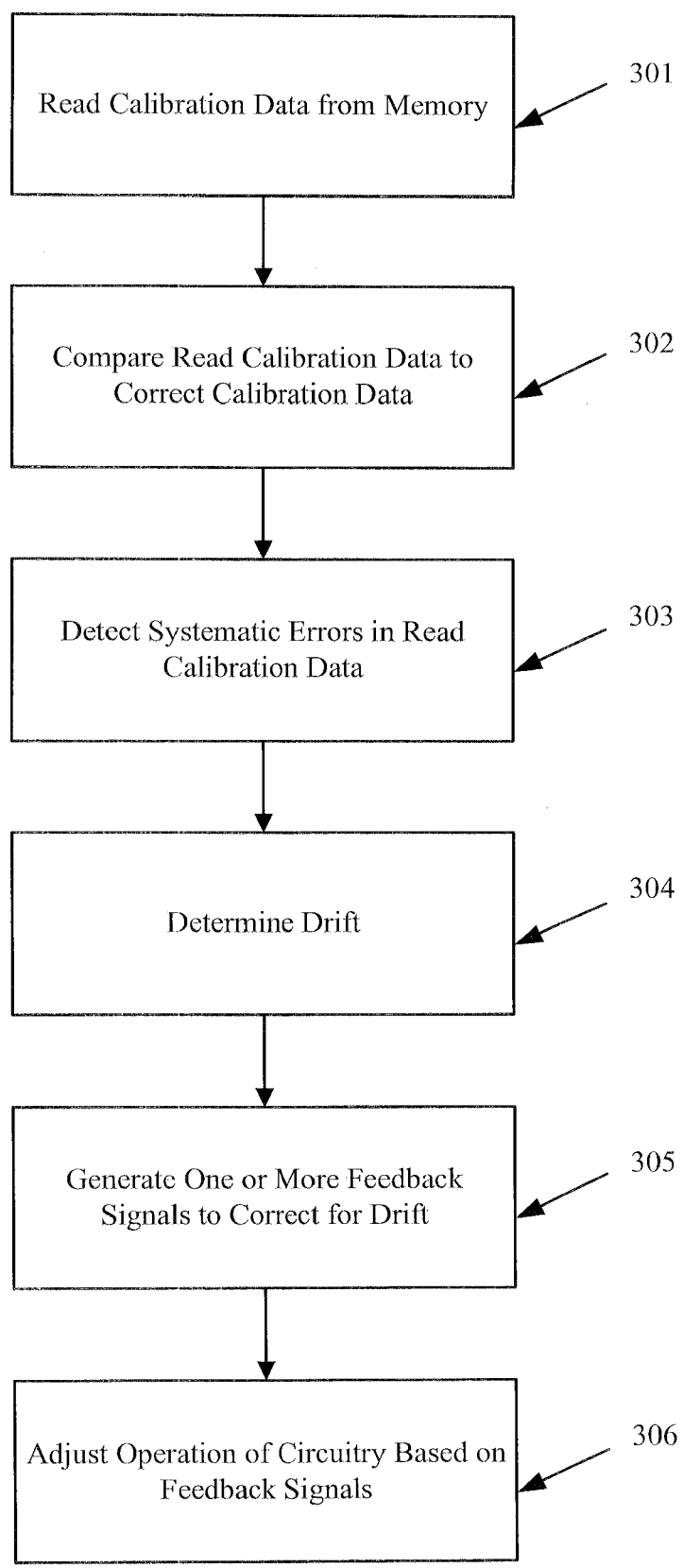

SYSTEMATIC ERROR CORRECTION FOR MULTI-LEVEL FLASH MEMORY

BACKGROUND OF THE INVENTION

1. Field of the Invention

The present invention relates to memory circuits and, and, in particular, to error correction in flash memory devices.

2. Description of the Related Art

High-density flash memories, such as USB-port mass-storage flash devices, SD cards, XD cards, and compact flash cards, generally use advanced error protection/correction data processing, such as BCH (Bose, Ray-Chaudhuri, Hocquenhem) and Reed-Soloman error correcting codes, to correct for defective or erroneous bits read from within the flash memory. High-density flash memory is typically limited to a maximum capacity of about 8 Gbytes. Evolution of high-density flash technology leads to more memory cells per chip, memory cells that store more than 2 binary bits of information, and more-sophisticated error correction techniques.

A single-level memory storage cell (SLC) contains a single binary bit of information represented as one of two levels of stored charge. When data is read from flash memory, the amount of charge stored within the flash memory cell is detected by sense amplifiers. Sense amplifiers usually generate digital output values based on the detected charge level, but some sense amplifiers might generate analog output values. FIG. 1A shows SLC flash memory 100 of the prior art having memory array 101 and sense amplifier unit 102. SLC flash memory 100 generates digital output values when addressed and read. Memory array 101 comprises SLC flash cells 103 addressed by particular row drivers (not shown in the figure). Sense amplifier unit 102 includes i) sense amplifiers 104 that sense the charge stored in a particular SLC, and ii) column decoder 105 (or digital multiplexer) that provides a particular binary bit value based on the output of a corresponding one of sense amplifiers 104 and a unique column address.

Flash memory has evolved from an SLC that contains a single binary bit (2-levels of charge store) to a multi-level cell (MLC) that contains a plurality of bits of information. Currently, the common implementation for an MLC contains 2 binary bits of information, each bit-pair represented as one of four available discrete charge levels stored within the cell.

A number of techniques exist for detecting the data state of an MLC. For an MLC capable of storing two bits of data in one of four discrete levels, one technique is to use multiple sense amplifiers, each capable of discriminating between two of the four possible charge levels within the cell. Instead of having a single sense amplifier associated with each column, as with the SLC flash memory shown in FIG. 1A, several sense amplifiers are associated with each column of the MLC flash memory, as illustrated in prior art MLC flash memory 110 of FIG. 1B.

MLC flash memory 110 comprises MLC flash cells 113 of MLC memory array 111, and sense amplifier unit 112 having multiple sense amplifiers (MSAs) 114, and column decoder 115. Table 1 shows two exemplary methods of using three sense amplifiers for an MSA to generate, when decoded by column decoder 115, an output 2-bit data code (00, 01, 10, 11) by logical combination of the sense amplifier output levels in the MSA.

TABLE 1

| Example | Sense Amplifier | Charge Levels Discriminated |
|---------|-----------------|------------------------------|
| 1 | 1 | Between Level 1 and Level 2 |
|   | 2 | Between Level 1 and Level 3 |
|   | 3 | Between Level 1 and Level 4 |
| 2 | 1 | Between Levels 1 + 2 and Levels 3 + 4 |
|   | 2 | Between Level 1 and Level 2 |
|   | 3 | Between Level 3 and Level 4 |

Another technique for MLC flash memory is the use of one sense amplifier which, in temporal sequence, discriminates between the three various pairs of levels (sequential sense amplifiers). Using sequential sense amplifiers generally results in smaller area on, for example, an integrated circuit (IC) implementation, than the multiple sense amplifier approach. However, because sensing is iterative, using sequential sense amplifiers takes a longer period of time for level detection. A prior art sequential sense amplifier MLC flash memory 120 is shown in FIG. 1C. Sequential sense amplifier MLC flash memory 120 includes MLC memory cell array 121 with MLCs 123, and sense amplifier unit 122 having sequential sense amplifiers (SSAs) 124, column decoder 125, and control logic 126. SSAs 124 are designed for sequential discriminations of different charge levels within the MLCs 123, and control logic 126 controls temporal sequencing of the sense amplifiers.

Flash memory cells store data by storing charge within the flash cell as follows. During write operations, electrons are either injected into or withdrawn from the charge storage structure within the cell. The cell is primarily implemented with a MOSFET (metal-oxide-semiconductor field-effect transistor) transistor that has a threshold voltage proportional to the charge stored. If the MOSFET is an N-channel transistor, the larger the amount of negative charge stored, the higher the threshold voltage. If the MOSFET is a P-channel transistor, the larger the amount of negative charge stored, the lower the threshold voltage. In an MLC cell, there are $2^N$ charge storage levels (CSLs), where N is the number of bits stored within the cell (e.g., if N=2, the CSL=4, and if N=4, the CSL=16). Two common types of charge storage structures within flash cells are in commercial production. The most common is the floating poly-silicon gate structure. Charge is stored on a conductive poly-silicon gate that is entirely surrounded by dielectric material. The less common charge storage structure is an oxide-nitride-oxide (ONO) gate dielectric structure in which charge is retained within the non-conductive dielectric structure.

In either case, the dielectric surrounding the charge storage structures, ideally, might prevent the charge from ever leaking off, or charge ever leaking onto, the charge storage structure. However, in practice, charge leaks at a rate that is dependent upon the physical and electrical characteristics of the structure. To have a good-quality flash memory cell, the rate of charge loss or gain should be very low (e.g., measurable in terms of years). The term "charge drift" is employed herein to mean charge leaking off of or onto the charge storage structure of the cell. The cell threshold voltage slowly drifts up or down as charge leaks off of or onto the charge storage structure, and the term "threshold drift" is employed herein to indicate this change in threshold voltage associated with the charge drift.

SUMMARY OF THE INVENTION

In one embodiment, the present invention allows for error correction of systemic errors in data read from a multi-level cell (MLC) memory by reading calibration data from the MLC memory and comparing the read calibration data to correct calibration data. Systematic errors are detected in the read calibration data based on the comparison and drift is detected for the systematic errors. One or more feedback signals are generated based on the determined drift to correct for the drift.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 3 shows an exemplary method of error protection as employed by the multi-level flash memory core of FIG. 2.

DETAILED DESCRIPTION

Figure 1A:
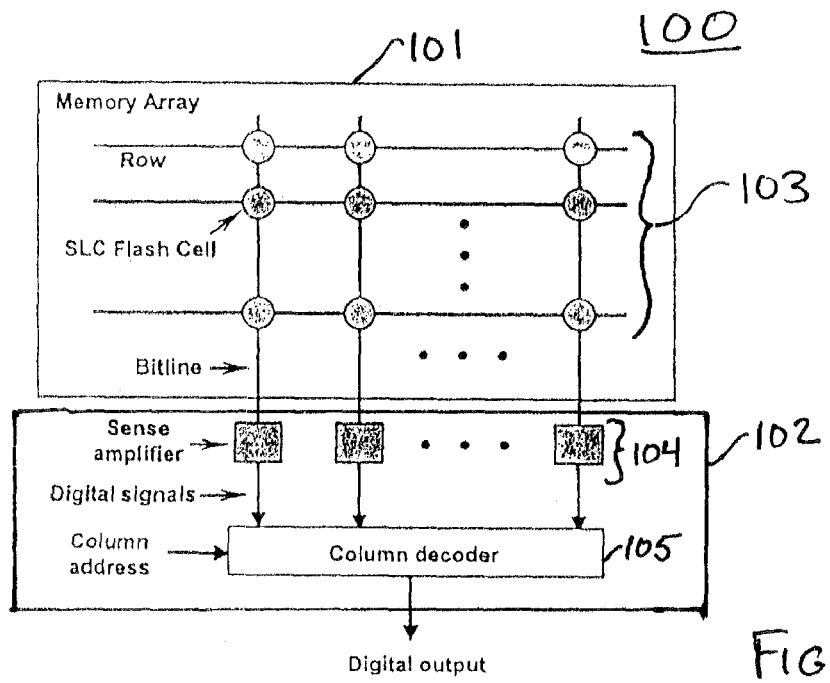
FIG. 1A shows single-level memory storage cell (SLC) flash memory of the prior art.

In accordance with exemplary embodiments of the present invention, a multi-level flash memory employs error correction of systematic errors when reading multi-level flash memory, where error correction includes i) detection of each systematic error, ii) feedback of the systematic error to circuitry within the memory, and iii) subsequent adjustment within that circuitry to cause a correction of systematic error in the output signal of the multi-level flash memory. FIG. 2 shows multi-level flash memory 200 employing an exemplary embodiment of the present invention. For the described embodiment of FIG. 2, a flash memory structure having analog output is shown (e.g., an analog multiplexer output), but the present invention is not so limited and might be applied to various flash memory structures, such as, for example, those described with respect to FIG. 1B and FIG. 1C (e.g., a digital multiplexer output).

Multi-level flash memory 200 comprises multi-level cells (MLCs) 203 of memory array 201, and sense amplifier unit 202 having single-sense amplifiers (SSAs) 204, where each of SSAs 204 is associated with a column of MLC flash memory cells. Each of SSAs 204 produces an analog output value that is proportional to the charge level within its associated one of MLCs 203 that is read. The analog outputs form a series of sense amplifier output values that are combined by analog multiplexer 205 in a temporal sequence to produce a continuous analog waveform representative of the multi-level data written into a group of MLC flash cells 203. Row driver block 206 comprises row drivers for memory array 201 that are employed to electrically drive rows of MLCs 203 when data is written or read.

In accordance with exemplary embodiments of the present invention, multi-level flash memory 200 also comprises error-correction control circuitry (ECCC) 207 and error processor 208. Operation of ECCC 207 and error processor 208 is described below.

Figure 1B:
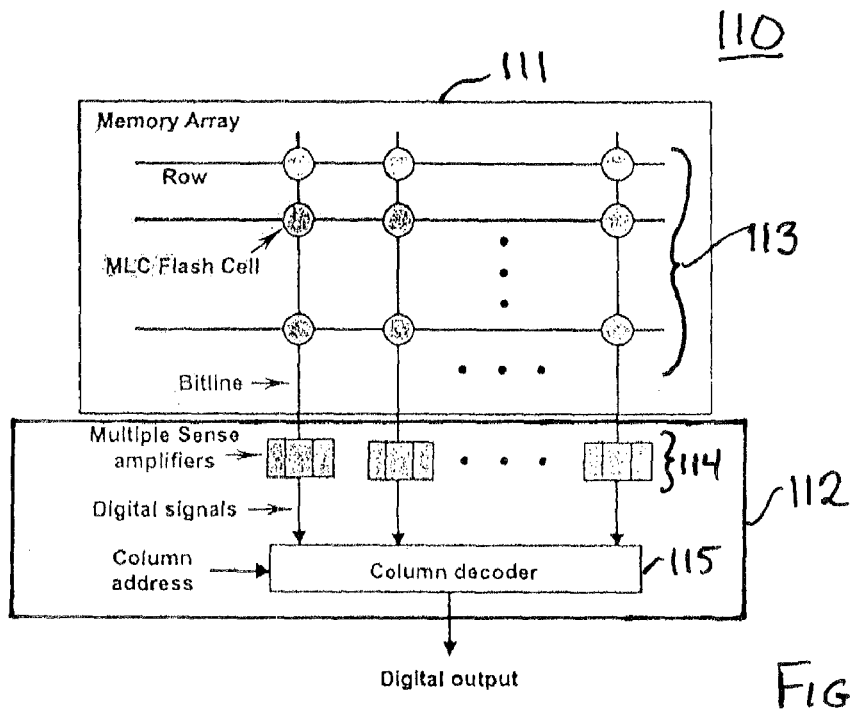
FIG. 1B shows multi-level memory storage cell (MLC) flash memory of the prior art.
Figure 1C:
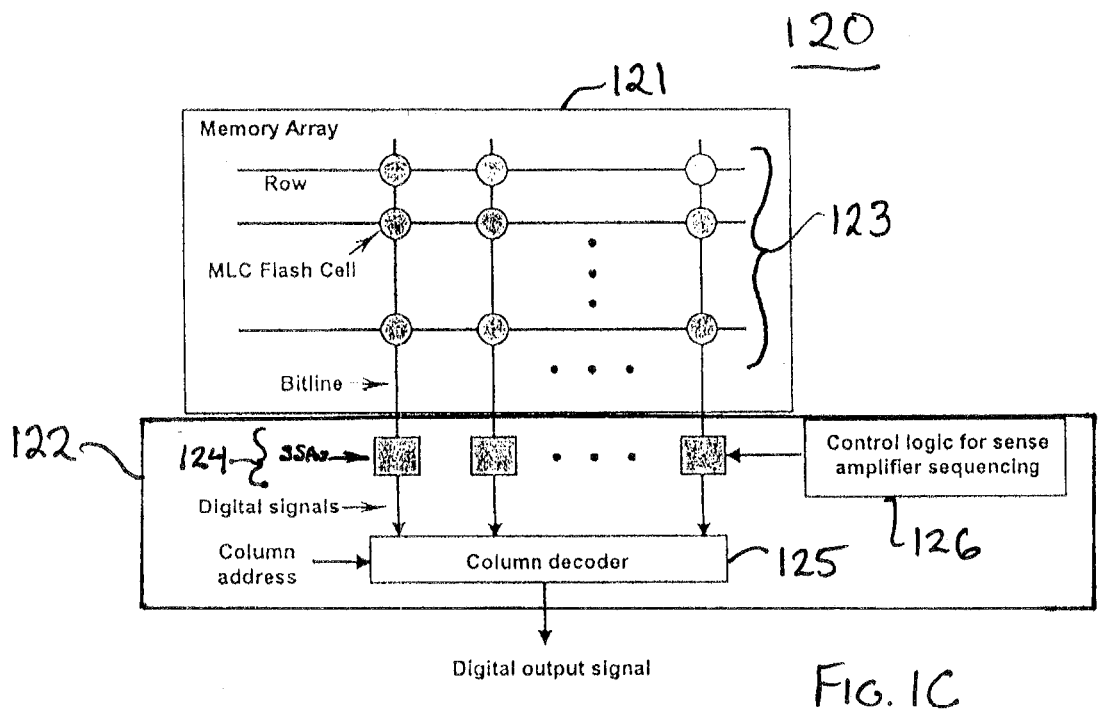
FIG. 1C shows a sequential sense amplifier MLC flash memory of the prior art.
Figure 2:
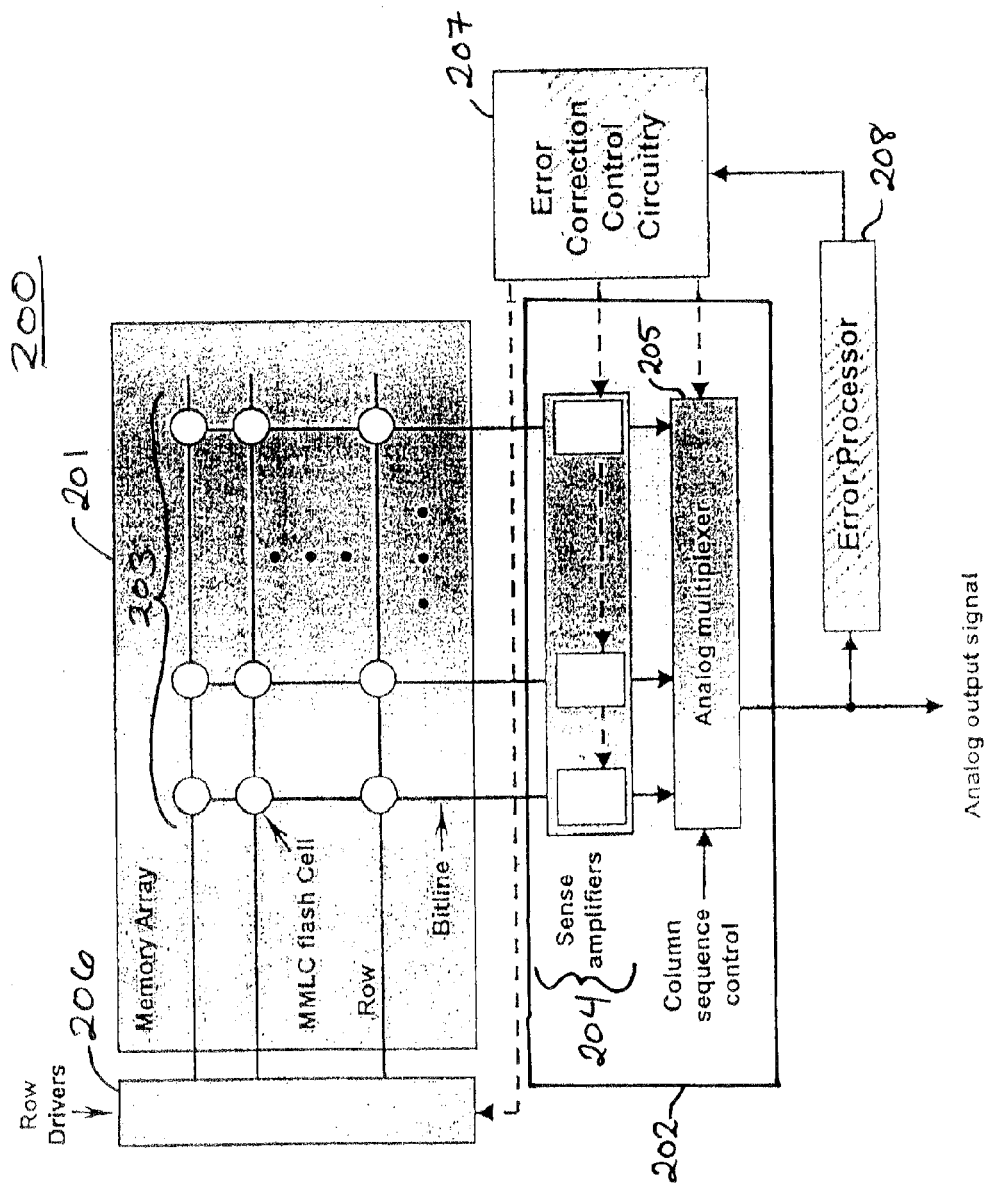
FIG. 2 shows a multi-level flash memory core employing an exemplary embodiment of the present invention.

In an MLC cell, a relatively small leakage of charge, and associated threshold change, causes a drift in the output of a sense amplifier from one binary number to an adjacent, or near, binary number in memories with digital outputs (e.g., memories shown in FIGS. 1B and 1C). In memories with analog outputs (e.g., memory shown in FIG. 1D), a relatively small leakage of charge, and associated threshold change, causes a drift in the analog output voltage. The term "sense amplifier output drift" is employed herein to indicate the change in digital or analog output values from the sense amplifier resulting from associated charge/threshold drift. The sense amplifier output drift is reflected in the digital column multiplexer (FIGS. 1B and 1C) digital output value and/or in the analog multiplexer (FIG. 1D) analog output signal. As employed herein, the term "output signal drift" encompasses the digital or analog output signal drift from the corresponding digital or analog multiplexer.

For mass-storage-type devices, relatively long streams of data, or sectors, are stored at one time. Ignoring between-cell differences, the cells storing one sector of data might exhibit charge leakage, or decay, at substantially the same rate. The charge leakage results in a systematic output signal drift in the digital or analog output signal for the entire sector. Each cell might substantially exhibit a charge drift in the same direction and by the same amount, but subtle differences in charge drift might exist depending upon the data stored in the cell.

In accordance with exemplary embodiments of the present invention, systematic errors are detected. Systematic errors occur in a long series of read data from cells that contain a continuous stream of data, such as one or more data sectors. The values in this stream of data are typically written as a continuous stream of data at approximately the same time. When written, additional data values might be appended or inserted into this stream of data that might be employed to calibrate the signal. The additional data values are termed herein as calibration data or calibration bits.

Returning to FIG. 2, when the stream of data is read from multi-level flash memory 200, error processor 208 is aware of the presence of calibration data in the data that is read from memory. Consequently, error processor 208 might detect and compare the calibration data read from multi-level flash memory 200 to expected (correct) calibration data. Error processor 208 detects systematic output signal drift by the deviation of the read calibration data from the correct calibration data that was originally written. Error processor 208 forwards a signal representative of the systematic output signal drift to ECCC 207.

ECCC 207 generates signals that are typically applied to one or more adjustable circuits within multi-level flash memory 200 to correct for systematic errors. For example, a feedback signal might be applied to analog multiplexer 205 causing analog multiplexer 205 to add bias voltage to its output signal to counteract systematic analog output signal drift. Alternatively, a feedback signal might be applied to SSAs 204 to counteract systematic analog sense amplifier output drift. Alternatively, a feedback signal might be applied to row driver block 206 to adjust (e.g., raise) the row voltage from row driver circuitry to cause a systematic change on the column voltages when reading each of MLCs 203 to compensate for sense amplifier output drift and/or the output signal drift. One or more of these feedback signal options might be employed, either alone or in combination. Correction adjusts the output signal from analog multiplexer 205 to accurately reflect data that was originally written into the group of cells that contain the sequential data.

When embodiments of the present invention are employed for systems having multiple sense amplifiers, sense amplifiers with sequential sensing, and/or digital multiplexers providing the output signal, similar types of feedback signals might be generated. For example, the feedback signal applied to a digital multiplexer might simply adjust its output signal to counteract systematic output signal drift, and the feedback signal applied to multiple sense amplifiers (MSAs) (or sense amplifiers with sequential sensing) is provided so as to counteract systematic analog sense amplifier output drift of each of the MSAs.

FIG. 3 shows an exemplary method of error protection as employed by the multi-level flash memory core of FIG. 2. At step 301, calibration data is read from memory and, at step 302, the read calibration data is compared to the correct calibration data. At step 303, the method detects systematic error(s) in the read calibration data, and, at step 304, the drift for the systematic error(s) is determined. At step 305, one or more feedback signals are generated based on the determined drift, and, at step 306, operation of circuitry within multi-level flash memory is adjusted to correct for the drift.

Since it is desirable to correct for drift soon after commencement of reading any specific group of sequential data, calibration data might typically be the first data read. Other error correction techniques known in the art may be employed in conjunction with the teachings herein to correct for errors before the adjustments are made. Additional types of errors might exist and methods might be employed to correct for these additional types of errors in combination with the error correction techniques of the present invention. For example, Hamming or block error correction code techniques (ECCs) might be employed to correct for single-bit errors within a smaller (fraction of a sector) group of data (word). In this case, ECCs are employed to correct for non-systematic errors, or sport-type errors, in addition to employing embodiments of the present invention for systematic or drift-type errors.

Subtle errors in charge drift might occur depending upon the data stored in the cell. If an MLC cell stores 4 bits of data, 16 discrete charge levels are possible. The rate of charge decay or charge drift might be modulated by the amount of charge stored in the cell. For example. Stored negative charge corresponding to the maximum negative charge stored (charge level 16) might most rapidly leak off of the charge storage node; stored negative charge corresponding to the minimum negative charge stored (charge level 1) might most rapidly leak onto the charge storage node; stored negative charge corresponding to just-above-median negative charge stored (charge level 9) might leak off of the charge node least rapidly; and stored negative charge corresponding to just-below-median negative charge stored (charge level 8) might leak onto the charge node least rapidly. Error processor 208 and ECCC 207 might be designed so as to compensate for this modulation.

The exemplary embodiment of FIG. 2 shows error processor 208 and ECCC 207 as circuitry residing outside of multi-level flash memory core, but the invention is not so limited. In practice, error correction control circuitry might be distributed through the multi-level flash memory core, or might be resident outside of the multi-level flash memory core on a separate integrated circuit (IC).

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation." In addition, unless explicitly stated otherwise, each numerical value and range should be interpreted as being approximate as if the word "about" or "approximately" preceded the value of the value or range.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A method of error correction for systemic errors in data read from a multi-level cell (MLC) memory, the method comprising the steps of:
    reading calibration data from the MLC memory;
    comparing the read calibration data to correct calibration data;
    detecting systematic errors in the read calibration data based on the comparison;
    determining drift for the systematic errors;
    generating one or more feedback signals based on the determined drift; and
    correcting for the drift based on the one or more feedback signals.

2. The invention of claim 1, wherein the step of detecting drift for the systematic errors detects at least one of sense amplifier output drift and output signal drift.

3. The invention of claim 2, wherein the step of generating one or more feedback signals generates a multiplexer feedback signal, and the step of correcting for the drift comprises the steps of applying the multiplexer feedback signal to a multiplexer and correcting for output signal drift of the multiplexer.

4. The invention of claim 2, wherein the step of generating one or more feedback signals generates a sense amplifier feedback signal, and the step of correcting for the drift comprises the steps of applying the sense amplifier feedback signal to at least one of a plurality of sense amplifiers and correcting for sense amplifier output drift of the sense amplifier.

5. The invention of claim 2, wherein the step of generating one or more feedback signals generates an MLC driver feedback signal, and the step of correcting for the drift comprises the steps of applying the MLC driver feedback signal to a row driver of an MLC.

6. The invention of claim 1, wherein the method further comprises the step of reading a sector of stored data within the MLC memory.

7. The invention of claim 6, wherein the method further comprises the step of applying error correction to a substring of bits of the sector of stored data.

8. The invention of claim 1, wherein the calibration data comprise bits stored in the MLC memory.

9. Apparatus for error correction for systemic errors in data read from a multi-level cell (MLC) memory, the apparatus comprising:
an error processor adapted to:
i) read calibration data from the MLC memory,
ii) compare the read calibration data to correct calibration data,
iii) detect systematic errors in the read calibration data based on the comparison, and
iv) determine drift for systematic errors; and
error correction control circuitry (ECCC) coupled to the error processor, wherein the ECCC is adapted to generate one or more feedback signals based on the determined drift for correction of the drift based on the one or more feedback signals.

10. The invention of claim 9, wherein:
the multi-level cell (MLC) memory includes a memory array having a plurality of MLCs, a multiplexer, and a plurality of sense amplifiers coupled between the memory array and the multiplexer;
the error processor is coupled to the multiplexer to read the calibration data,
the ECCC is coupled to at least one of the memory array, the plurality of sense amplifiers, and the multiplexer.

11. The invention of claim 10, wherein the error processor is adapted to detect at least one of sense amplifier output drift and output signal drift.

12. The invention of claim 11, wherein the one or more feedback signals comprises a multiplexer feedback signal, and the ECCC is adapted to apply the multiplexer feedback signal to the multiplexer to correct for output signal drift of the multiplexer.

13. The invention of claim 11, wherein the one or more feedback signals comprises a sense amplifier feedback signal, and the ECCC is adapted to apply the sense amplifier feedback signal to at least one of the plurality of sense amplifiers to correct for sense amplifier output drift of the sense amplifier.

14. The invention of claim 11, wherein the one or more feedback signals comprises an MLC driver feedback signal, and the ECCC is adapted to apply the MLC driver feedback signal to a row driver of the MLC memory.

15. The invention of claim 10, wherein one or more of the plurality of MLCs are implemented as a MOSFET (metal-oxide-semiconductor field-effect transistor) transistor with either an ONO gate storage structure or a poly-silicon gate storage structure.

16. The invention of claim 10, wherein the multiplexer is an analog multiplexer and each of the plurality of sense amplifiers generates an analog output value representing a charge level corresponding to a bit value of a corresponding one of the plurality of MLCs.

17. The invention of claim 10, wherein the multiplexer is a digital multiplexer and each of the plurality of sense amplifiers generates a digital output value representing a charge level corresponding to an N-bit value of a corresponding one of the plurality of MLCs, N being an integer greater than 1.

18. The invention of claim 9, wherein the apparatus is embodied in an integrated circuit.

19. The invention of claim 18, wherein the apparatus is integrated with the MLC memory.

20. The invention of claim 9, wherein the calibration data comprise bits stored in the MLC memory.

* * * * *